United States Patent
Yamada

(10) Patent No.: US 6,815,730 B2
(45) Date of Patent: Nov. 9, 2004

(54) NITRIDE-BASED SEMICONDUCTOR LIGHT-EMITTING DEVICE

(75) Inventor: Eiji Yamada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/058,578

(22) Filed: Jan. 28, 2002

(65) Prior Publication Data

US 2002/0109146 A1 Aug. 15, 2002

(30) Foreign Application Priority Data

Jan. 31, 2001 (JP) ........................................ 2001-022732

(51) Int. Cl.[7] .............................................. H01L 33/00
(52) U.S. Cl. ........................... 257/101; 257/79; 257/85; 257/94; 257/102; 257/103; 438/87; 438/231
(58) Field of Search .............................. 257/81, 88, 92, 257/93, 98, 99, 100, 690, 700

(56) References Cited

U.S. PATENT DOCUMENTS

| 6,441,393 B2 | * | 8/2002 | Goetz et al. | ................... 257/13 |
| 6,455,877 B1 | * | 9/2002 | Ogawa et al. | ................ 257/99 |
| 6,518,602 B1 | * | 2/2003 | Yuasa et al. | ................ 257/102 |

FOREIGN PATENT DOCUMENTS

| JP | 08-148718 | 6/1996 |
| JP | 2000044400 A | 2/2000 |

* cited by examiner

Primary Examiner—Long Pham
Assistant Examiner—Wai-Sing Louie
(74) Attorney, Agent, or Firm—Morrison & Foerster LLP

(57) ABSTRACT

A nitride-based semiconductor light-emitting device includes a GaN-based substrate and a semiconductor stacked-layer structure including a plurality of nitride-based semiconductor layers grown on the GaN-based substrate by vapor deposition. The GaN-based substrate has an interface region contacting the semiconductor stacked-layer structure and the interface region contains oxygen atoms of concentration n in the range of $2 \times 10^{16} \leq n \leq 10^{22}$ cm$^{-3}$.

7 Claims, 7 Drawing Sheets

NITRIDE-BASED SEMICONDUCTOR LIGHT-EMITTING DEVICE

BACKGROUND OF THE INVENTION

1. Field of the Invention

The present invention relates to semiconductor light-emitting devices (including light-emitting diode (LED) and laser diode (LD)) and particularly to improvements in operating voltage, luminous efficiency, lifetime, and yield of nitride-based semiconductor light-emitting devices.

2. Description of the Background Art

Nitride semiconductor materials such as GaN, InN, AlN, and mixed crystals thereof have a band gap where direct interband transition occurs. In particular, a mixed crystal of InGaN can emit radiation in the wavelength range from red to ultraviolet, and accordingly attracts attention as a material for short-wavelength radiation. A light-emitting diode capable of emitting radiation in the wavelength range from ultraviolet to green has already got practicability by utilizing the mixed crystal of InGaN. Further, a bluish violet laser diode achieves a lifetime longer than 10,000 hours under a condition of continuous lasing at the room temperature. As such, semiconductor light-emitting devices for short-wavelength radiation are making rapid progress toward commercialization thereof.

One of factors for such rapid progress is that ELOG (Epitaxial Lateral Over Growth) technique can reduce the dislocation density in a nitride-based semiconductor layer. That is, it has been found in recent years that application of ELOG technique to growth of a GaN layer on a sapphire substrate is effective in reduction of dislocations which are generated when the GaN layer is grown by HVPE (Hydride Vapor Phase Epitaxy) method. The GaN layer grown by ELOG technique includes less defects of threading dislocations and the like. It is accordingly reported that an LD produced by using such a GaN layer can exhibit a longer lifetime. On the other hand, it is proposed to use a thick film of GaN produced by HVPE as a substrate. The substrate of such a thick GaN film can be used to reduce crystal defects in a nitride-based semiconductor layer grown on the substrate by metal-organic chemical vapor deposition (MOCVD) etc., promising a longer lifetime of a resultant nitride-based semiconductor light-emitting device.

Although currently produced GaN-based substrates include dislocation defects reduced to some degree by utilizing the ELOG technique etc., they still have a considerably higher dislocation density than that of other group III–V compound semiconductor substrates such as GaAs substrate. Moreover, N and Ga are likely to escape out of the GaN substrate, especially out of the substrate interface, due to a high equilibrium vapor pressure of nitrogen, which causes an increased defect density. Therefore, a nitride-based semiconductor light-emitting device formed by MOCVD on a GaN substrate still contains lots of crystal defects. Such defects act as centers for non-radiative recombination, and the defective portions serve as current paths to cause current leakage. Here, a problem is that light-emitting devices containing lots of crystal defects need higher drive voltage and result in less yield.

In particular, crystal defects in an LD increase the threshold current density and then shorten the lifetime of the LD, and thus reduction of the defect density is important. There also exists a problem that light-emitting devices fabricated on a wafer produced by ELOG have respective emission outputs greatly different from each other depending upon their position on the wafer, because the dislocation density in the wafer is higher in some regions and lower in the other regions. Then, emission patterns were observed in light-emitting devices with emission outputs more than 2 mW and light-emitting devices with emission outputs less than 0.5 mV that were fabricated on the same wafer. It was found that the devices of lower outputs cause non-uniform radiation in which dark and bright portions were mixed. In addition, the lower-output devices had their shorter lifetimes and 90% thereof stopped emission shortly after electric current is supplied. Due to this, the total yield of the devices was as low as about 45%. The dark portions in the lower-output devices correspond to regions with high dislocation density in the GaN substrate, and it is considered that the defects in the GaN substrate affect the dark portions.

SUMMARY OF THE INVENTION

In view of the problems in the prior art discussed above, an object of the present invention is to improve the operating voltage, luminous efficiency, lifetime, and yield in the nitride-based semiconductor light-emitting devices.

A nitride-based semiconductor light-emitting device according to the present invention includes a semiconductor stacked-layer structure including a plurality of nitride-based semiconductor layers grown on a GaN-based substrate by vapor phase deposition. An interface region of the GaN-based substrate contacting the semiconductor stacked-layer structure contains oxygen atoms at a concentration n in the range of $2 \times 10^{16} \leq n \leq 10^{22}$ cm$^{-3}$, and then the semiconductor stacked-layer structure has a lower crystal defect density as compared with that in the case that the interface region does not contain oxygen atoms at such a concentration n.

The GaN-based substrate may contain at least one of chlorine and oxygen. A nitride-based semiconductor layer included in the semiconductor stacked-layer structure, which is in direct contact with the GaN-based substrate, may contain oxygen.

With reference to FIG. 1, an explanation is here given regarding oxygen doping in the interface region of the GaN substrate that is in contact with the nitride-based semiconductor stacked-layer structure. FIG. 1 shows SIMS (secondary ion mass spectrometry) profiles obtained by oxygen doping in the vicinity of the interface between the GaN substrate and a nitride semiconductor layer grown thereon by MOCVD. In this graph, the horizontal axis represents layer thickness (nm) and the vertical axis represents concentration (cm$^{-3}$) of oxygen atoms. The layer thickness of 0 nm represents a surface when SIMS is started, and the oxygen atom concentration of $10^{16}$ cm$^{-3}$ corresponds to the concentration without positive or effective doping of oxygen atoms. Any ion concentration lower than $10^{16}$ cm$^{-3}$ is difficult to identify due to noise in SIMS.

The oxygen doping in the present invention is effective in relaxing strain caused in the interface region between the substrate and the crystal growth layer and preventing deterioration of crystallinity from being caused by N escape, Ga escape, etc. in the vicinity of the interface. In this case, the interface region of the substrate that contacts the crystal growth layer may have a thickness of single-atom layer to be doped with oxygen. However, the interface region is preferably doped in a thickness range that is likely to suffers damage during new crystal growth. Specifically, the advantage discussed above becomes clear when the interface region is doped in a thickness of at least 1 nm and becomes clearer when doped in 20 nm thickness. The interface region may be doped in a thickness exceeding 20 nm, but the doping effect with such a large thickness does not show much difference.

FIG. 1 shows SIMS profiles obtained by measuring oxygen distribution near the interfaces when oxygen atoms are added to the interface regions of at least 15 nm thickness in the substrates. SIMS measurement does not have a high accuracy with respect to the thickness direction and thus it is considered that oxygen would be observed in a range slightly greater than that of the region to which oxygen atoms are actually added.

The profile represented by curve A in FIG. 1 is obtained actually by adding oxygen atoms to a GaN buffer layer formed directly on a GaN substrate for fabricating a light-emitting device, and thus oxygen atoms are not directly added into the substrate. Regarding curve A, therefore, it is considered that the oxygen atoms diffuse into the formed substrate due to thermal hysteresis of heating during fabricating the light-emitting device on the substrate. Similarly, the profile represented by curve B in FIG. 1 is obtained by exposing a formed substrate to the atmosphere and thereafter forming a light-emitting device structure on the substrate, and thus oxygen atoms are not directly added into the substrate nor into the light-emitting device structure thereon. For curve B, however, oxygen atoms are detected in both of the substrate side and the light-emitting device side. Therefore, it is considered that oxygen atoms absorbed on the substrate surface in the atmosphere diffuse into both of the substrate and the light-emitting device structure due to thermal hysteresis of the substrate.

FIG. 2 shows the change of the emission output of a blue LED formed by HVPE on a GaN substrate, with respect to the oxygen doping amount in the interface region of the substrate. In this graph, the horizontal axis represents oxygen doping amount ($cm^{-3}$) in the interface region of the substrate and the vertical axis represents emission output $P_0$ by an arbitrary unit (a.u.). The emission output observed when no oxygen is added to the interface region of the substrate is defined as reference value 1 of the arbitrary unit.

Referring to FIG. 2, the emission output is 1.2 (a.u.) when the oxygen doping amount is $2\times10^{16}$ $cm^{-3}$. As the doping amount increases therefrom, the emission output steeply increases. When the doping amount is about $10^{18}$ $cm^{-3}$, the emission output reaches the maximum value of 2.5, and thereafter the emission output gradually decreases. The emission output is still 1.1 even if the doping amount increases to $10^{22}$ $cm^{-3}$. It is thus seen that the emission output is enhanced by oxygen doping. However, when the doping amount is increased to or greater than $2\times10^{22}$ $cm^{-3}$, the emission output decreases to 0.6 or smaller. Possible reasons for these phenomena are described below.

Because of the high equilibrium vapor pressure of nitrogen as described above, nitrogen atoms escape out of the GaN substrate, particularly out of the region near the substrate interface, so that lots of vacancies of N sites are generated and accordingly the defect density increases. Then, a nitride semiconductor layer directly grown on this substrate by MOCVD etc. generates dislocation defects etc. that result from the strain of the substrate. Here, the substrate is doped with oxygen having a greater bonding force with Ga than that of nitrogen and thus being thermally stable, and the added oxygen atoms accordingly move into and fill the vacancies of N sites. Moreover, respective atomic radii of nitrogen and oxygen are almost equal to each other and thus strain in the substrate is unlikely to occur even if oxygen atoms fill N sites. Therefore, oxygen doping can reduce the crystal defect density. In addition, oxygen acts as a donor in the GaN crystal, which reduces the resistivity of the GaN crystal. However, an oxygen atom concentration equal to or lower than $10^{16}$ $cm^{-3}$ is not enough to fill all of the vacancies of N sites with oxygen atoms, so that reduction of the defect density, improvement of the emission output of a resultant light-emitting device, and decrease of the resistivity of the GaN crystal can not be achieved.

On the other hand, when oxygen atoms with a concentration equal to or higher than $2\times10^{22}$ $cm^{-3}$ are added into the substrate or the region near the substrate interface, the oxygen atoms replace nitrogen atoms and further become interstitial atoms to strain the GaN crystal. As a result, the dislocation defects in a resultant light-emitting device increases as the doping amount excessively increases to cause the emission output not to increase but to drastically decrease.

In a GaN substrate produced by HVPE, chlorine atoms exist in N sites or as interstitial atoms and there is the difference in atomic radius between chlorine and nitrogen, so that strain is caused in the GaN crystal. A nitride semiconductor layer directly grown on this substrate by MOCVD etc. thus includes dislocation defects etc. resultant from the strain in the substrate. Here, when oxygen atoms having high reactivity are added into the substrate or substrate interface, oxygen atoms instead of chlorine atoms predominantly enter N sites within the GaN crystal and act as donors. The difference in atomic radius between oxygen and nitrogen is smaller than that between chlorine and nitrogen. Thus, oxygen atoms can be added into the GaN substrate containing chlorine atoms to reduce dislocation defects etc. In this case too, however, the oxygen doping amount of $10^{16}$ $cm_{-3}$ or less cannot sufficiently fill vacancies of N sites with oxygen atoms and it is not enough to reduce the defects. On the other hand, when oxygen atoms are added at a concentration of $2\times10^{22}$ $cm^{-3}$ or higher, the increased oxygen atoms present as interstitial atoms strain the crystal. As a result, dislocation defects increase in a resultant light-emitting device and lower the emission output of the device.

For the reasons described above, the present invention can reduce the crystal defect density in a light-emitting device fabricated on a GaN substrate by doping a region near the GaN substrate interface with oxygen atoms at a predetermined concentration. In this way, nitride semiconductor light-emitting devices having a high luminous efficiency and a long lifetime can be produced with satisfactory yield. Moreover, the reduced crystal defect density decreases pass current, and the oxygen acts as a donor to decrease the resistivity of the substrate. Consequently, the drive voltage of the light-emitting devices can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
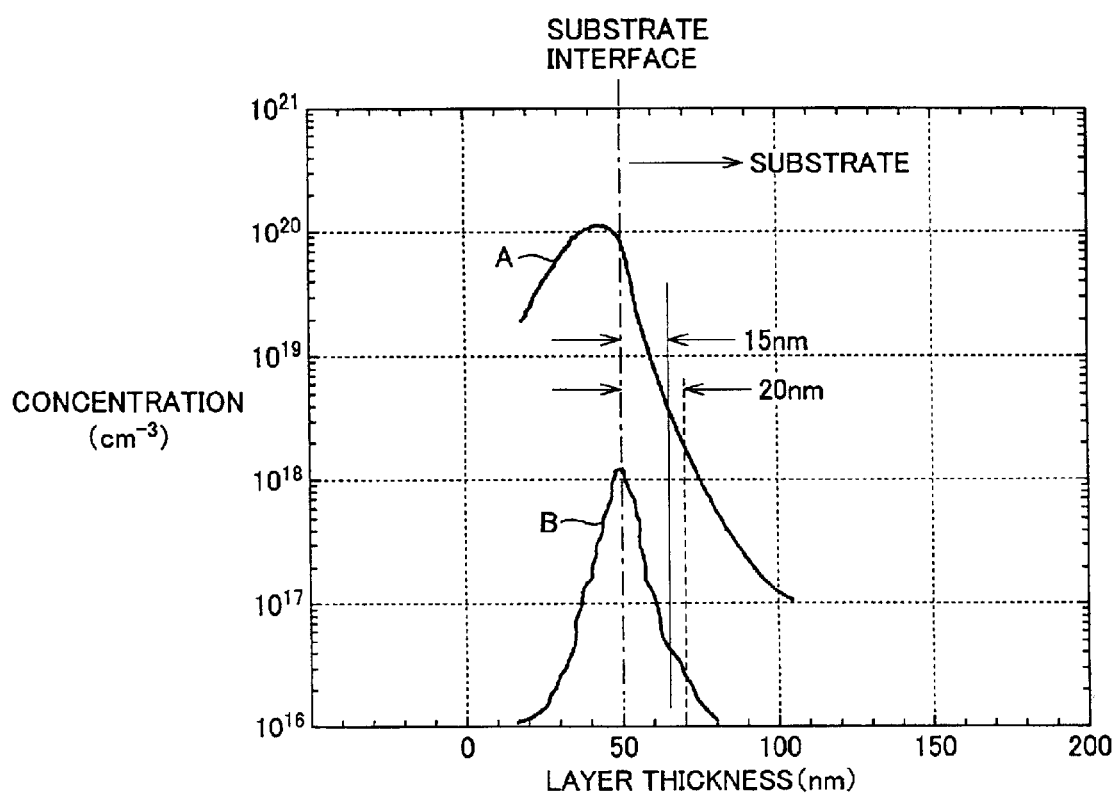
FIG. 1 is a graph showing SIMS profiles when a region near a GaN substrate interface is doped with oxygen according to the present invention.
Figure 2:
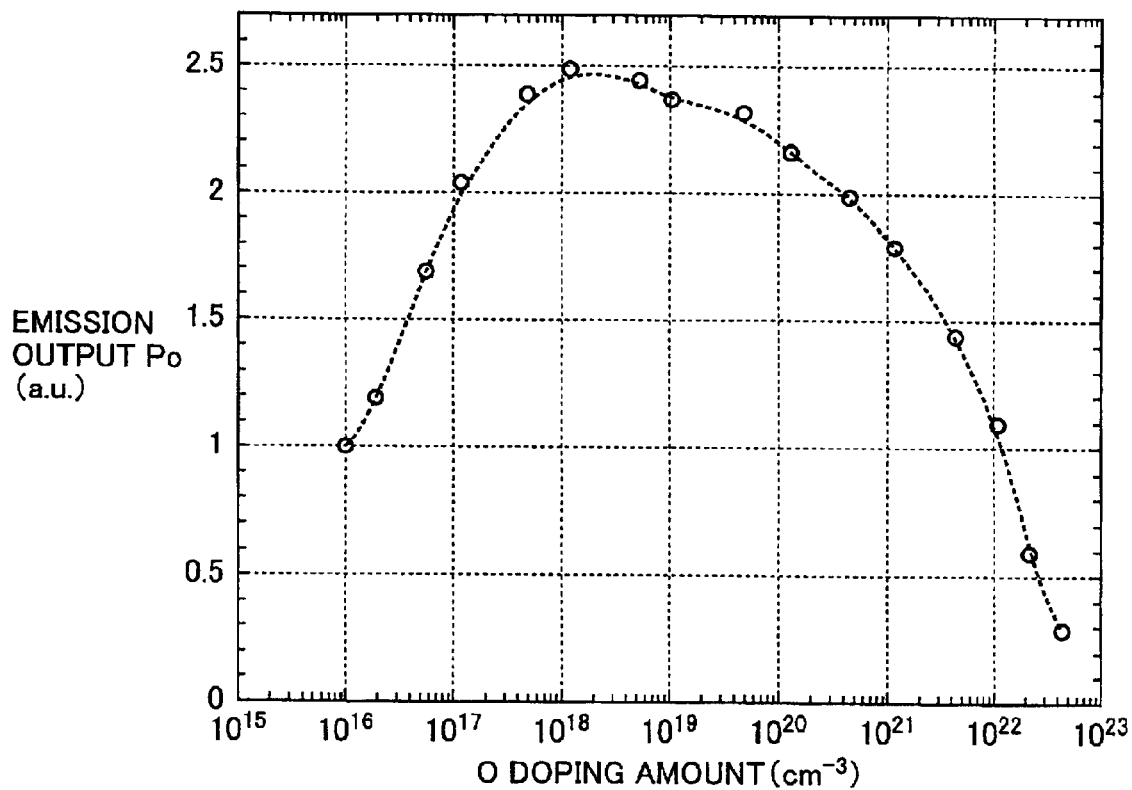
FIG. 2 is a graph showing relation between the emission output and the amount of oxygen with which the inside of a GaN substrate or an interface region of the substrate is doped.
Figure 3:
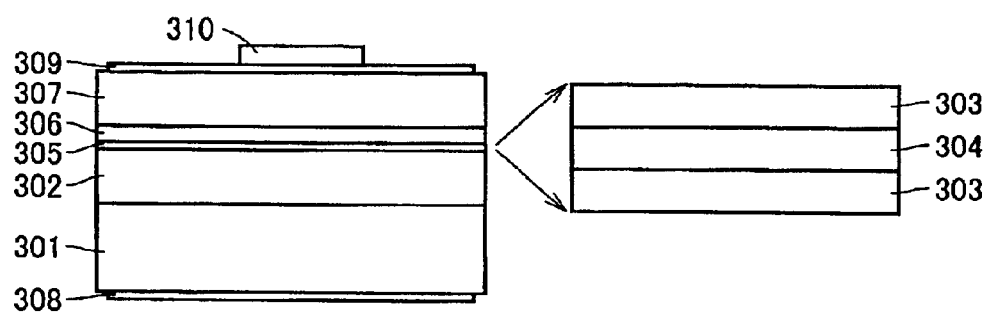
FIG. 3 diagrammatically shows a cross section of a nitride semiconductor light-emitting device as one example according to the present invention.

FIG. 3 diagrammatically shows a cross section of a light-emitting device according to a first embodiment of the present invention. The light-emitting device includes an Si-doped n-type GaN substrate 301 produced by HVPE. The interface of the substrate is doped with oxygen by exposing the produced substrate to the atmosphere for a predetermined time to cause adsorption of oxygen on the substrate interface. A plurality of nitride semiconductor layers are thereafter deposited on substrate 301 by MOCVD. Specifically, an Si-doped n-type GaN layer 302 and a light-emitting layer 305 are successively deposited. Light-emitting layer 305 has a DQW (double quantum well) structure including Si-doped InGaN layers 303 and a non-doped GaN layer 304. On light-emitting layer 305, an AlGaN anti-evaporation layer 306 is formed for preventing evaporation of the light-emitting layer in the manufacturing process. On anti-evaporation layer 306, an Mg-doped p-type GaN layer 307 is formed. Finally, an n-type electrode 308, a p-type light-transmissive electrode 309, and a p-type electrode 310 are formed by vapor phase deposition. The method of manufacturing this light-emitting device is hereinafter described in more detail.

Figure 4:
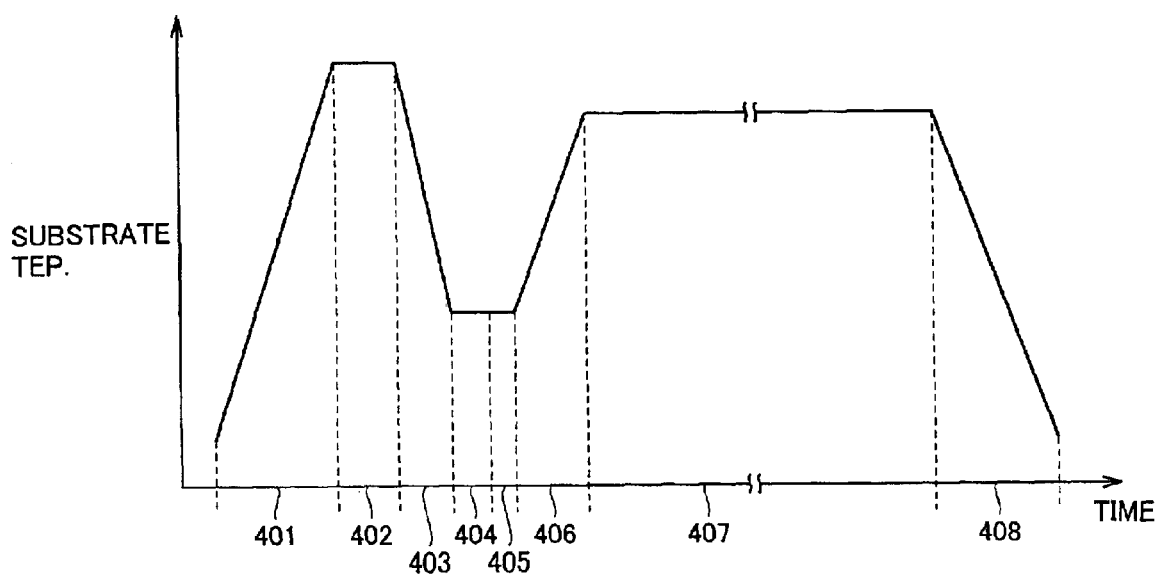
FIG. 4 is a graph showing substrate temperature in a process of producing a GaN substrate in the present invention.

FIG. 4 shows the substrate temperature change in a process of producing the GaN-based substrate. The horizontal axis of the graph in FIG. 4 represents time and the vertical axis represents set temperature of the substrate. HVPE is used to grow the GaN-based substrate. Specifically, Ga metal is heated to 850° C. to react with HCl gas, and resultant $GaCl_3$ is used as a transport gas for group III element Ga. $NH_3$ is used as a transport gas for group V element N. $SiH_4$ (silane) or TEOS (chemical formula: $Si(OC_2H_5)_4$) is used as a transport gas for n-type dopant Si or O, and then $Cp_2Mg$ (biscyclopentadienylmagnesium) or ethyl $Cp_2Mg$ is used as a transport gas for p-type dopant Mg. A sapphire substrate is employed as a base substrate on which the GaN substrate is grown.

In order to produce GaN substrate 301 shown in FIG. 3, the sapphire substrate is first heated to 1175° C. in a period 401 in FIG. 4. In a period 402, the substrate is thermally cleaned in a hydrogen atmosphere. After this, in a period 403, the substrate temperature is lowered to 550° C., and the temperature is made stable in a period 404. In a period 405, a GaN buffer layer is grown on the sapphire substrate to 50 nm thickness. Then, in a period 406, the substrate temperature is raised to 1125° C. In a period 407, a thick film of Si-doped GaN is grown to 310 μm thickness at a deposition rate of 60 μm/h. After the film deposition, in a period 408, the substrate temperature is lowered to room temperature. A resultant wafer is lapped from the sapphire substrate side by a grinding machine to remove the sapphire substrate and the GaN buffer layer. Then, with fine diamond abrasive, the wafer is polished. In this way, a thick film substrate of Si-doped GaN having 300 μm thickness is obtained.

Figure 5:
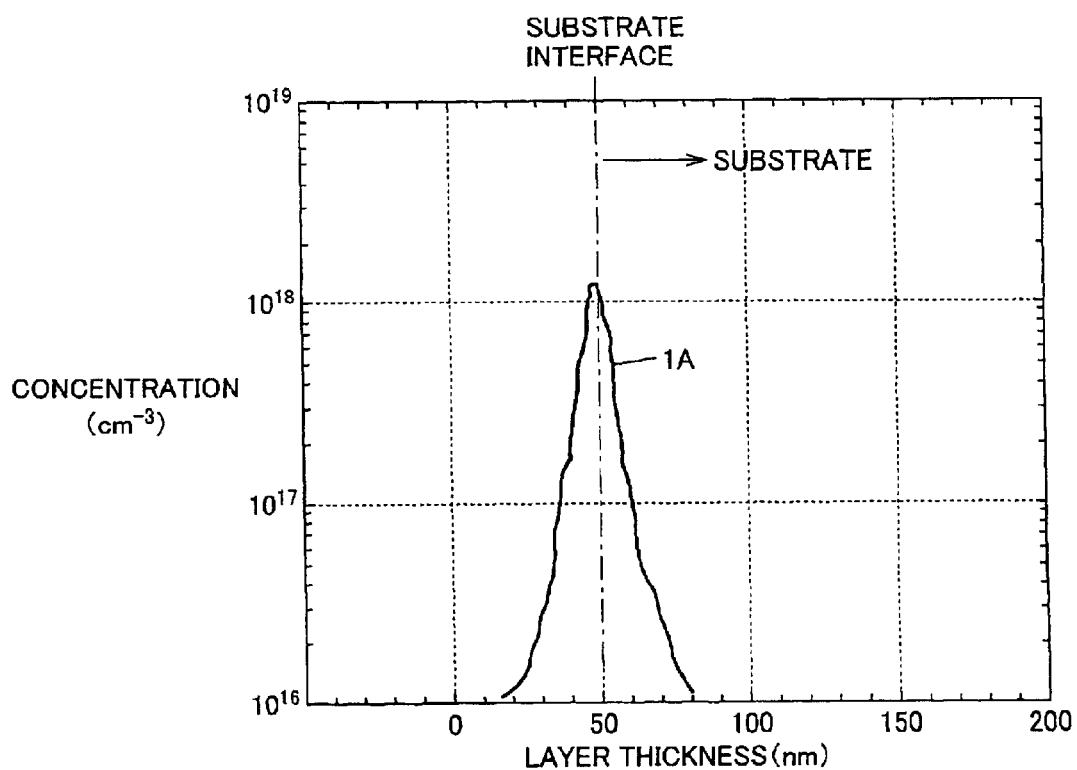
FIG. 5 is a graph showing another SIMS profile of the oxygen concentration in the vicinity of the GaN substrate interface in the present invention.

The obtained GaN substrate is exposed to the atmosphere. Adsorption of oxygen on the substrate surface is utilized for doping an interface region of the substrate with oxygen. A graph of FIG. 5 shows an SIMS profile in the vicinity of the substrate interface of a light-emitting device formed by using this GaN substrate. Specifically, curve 1A represents an oxygen concentration profile in the region near the interface of the GaN substrate in the first embodiment. It is seen that the maximum concentration of oxygen atoms contained in this region is $1.3 \times 10^{18}$ cm$^{-3}$. Without intentional or positive oxygen doping, the oxygen concentration measured by SIMS is $10^{16}$/cm$^{-3}$ or lower corresponding to the detectable minimum concentration. In the first embodiment, no chlorine is detected in the GaN substrate. This is because the GaN substrate is grown at a high temperature, which increases the equilibrium vapor pressure of chlorine. Although a lower growth temperature of the GaN substrate causes chlorine to be detected in the substrate, adverse influences of the chlorine can be reduced by oxygen doping.

MOCVD is used for growing the nitride-based semiconductor layers on the GaN substrate that are included in the light-emitting device. First, Si-doped n-type GaN substrate 301 is heated in a hydrogen atmosphere containing $NH_3$ to a temperature at which Si-doped GaN layer 302 is grown, in order to prevent N from escaping out of GaN substrate 301 during the temperature raise. In the atmosphere gas for heating, at least 0.05 ppb of oxygen or moisture is contained. By the effect of the partial oxygen pressure, oxygen absorbed on the substrate surface is not reduced but taken into the substrate interface region under a satisfactory control, so that it is possible to obtain the substrate interface including less strain.

Si-doped GaN layer 302 is grown to 0.5 μm thickness. Then, light-emitting layer 305 is grown including 2 nm-thick Si-doped $In_{0.35}Ga_{0.65}N$ quantum well layers 303 and 20 nm-thick non-doped GaN barrier layer 304 and thus having a multiple quantum well structure with period 2 (formed of two well layers and one barrier layer). After this, 25 nm-thick Mg-doped p-type $Al_{0.2}Ga_{0.8}N$ anti-evaporation layer 306 and 0.5 μm-thick Mg-doped p-type GaN layer 307 are successively grown. On the rear side of Si-doped n-type GaN substrate 301 in the obtained wafer, n-type electrode 308 of Ti/Al is vapor-deposited, and then p-type light-transmissive electrode 309 of Pd and p-type electrode 310 of Pd/Au are successively vapor-deposited on the surface of Mg-doped p-type GaN layer 307. Thereafter, the wafer is divided into a plurality of light-emitting device chips (see FIG. 3), and respective LEDs are completed through resin molding. Here, materials for p-type light-transmissive electrode 309 and p-type electrode 310 may be Ni and Ni/Au respectively.

The light-emitting device of the first embodiment has an operating voltage of 2.5 V at a forward current of 20 mA. The device emits blue light with a peak wavelength of 470 nm, and emission output thereof is 6 mW. When the forward current varies within 5 mA to 20 mA, the peak wavelength shifts by 1 nm or less. The distribution of peak wavelengths of a plurality of light-emitting devices obtained from the same wafer is within 5 nm. The light-emitting devices have their lifetimes of at least 20,000 hours under a continuous energization test with 20 mA at the room temperature.

On the other hand, a GaN substrate for comparison is produced without intentional or positive oxygen doping. In other words, this Si-doped GaN substrate does not have an oxygen concentration exceeding $10^{16}$ cm$^{-3}$ with measurement by SIMS. An LED formed on this substrate and having the cross-sectional structure as shown in FIG. 3 has an operating voltage of 3.4 V at the forward current of 20 mA. This LED emits blue light with a peak wavelength of 470 nm and has an emission output of 3 mW. The peak wave length shifts by 5 nm as the current changes. The distribution of peak wavelengths of light-emitting devices obtained from the same wafer is within 10 nm, and the light-emitting devices have a lifetime of 10,000 hours.

It is seen from the above that oxygen doping in the vicinity of the GaN substrate interface can reduce crystal defects not only in the GaN substrate interface region but also in a plurality of nitride semiconductor layers grown on that substrate, and accordingly can improve emission output of light-emitting devices. Further, since the oxygen doping improves electrical characteristics of nitride semiconductor crystal, the operating voltage of light-emitting devices can be reduced.

As seen from the above, the light-emitting devices of the first embodiment exhibit the doubled emission output, one-fifth peak wavelength shift, half peak wavelength distribution, more than double lifetime, and operating voltage reduced from 3.4 V to 2.5 V, as compared with the conventional devices.

Second Embodiment

A second embodiment differs from the first embodiment only in that the temperature for producing GaN substrate 301 and the method of doping the substrate with oxygen are changed. Specifically, in the second embodiment, from the beginning of a growth process of GaN substrate 301, a source gas for oxygen is supplied into a reactor for uniformly doping the inside of the GaN substrate with oxygen.

Similarly as the first embodiment, the second embodiment uses HVPE for growth of GaN substrate 301. Specifically, Ga metal is heated to 850° C. to react with HCl gas, and resultant GaCl$_3$ is used as a transport gas for group III element Ga. NH$_3$ is used as a transport gas for group V element N. SiH$_4$ or TEOS is used as a transport gas for n-type dopant Si or O, and then Cp$_2$Mg or ethyl Cp$_2$Mg is used as a transport gas for p-type dopant Mg. O$_2$ or TEOS is used for oxygen doping. A sapphire substrate is employed as a base substrate on which the GaN substrate is grown.

The sapphire substrate is first heated to 1100° C. in period 401 in FIG. 4. In period 402, the substrate is thermally cleaned in a hydrogen atmosphere. After this, in period 403, the substrate temperature is lowered to 550° C., and the temperature is made stable in period 404. In period 405, a GaN buffer layer is grown on the sapphire substrate to 50 nm thickness. Then, in period 406, the substrate temperature is raised to 1050° C. In period 407, a thick film of O-doped GaN is grown to 310 $\mu$m thickness at a deposition rate of 60 $\mu$m/h, while O$_2$ is supplied as n-type dopant. After the film deposition, the substrate temperature is lowered to room temperature in period 408. A resultant wafer is lapped from the sapphire substrate side by a grinding machine to remove the sapphire substrate and the GaN buffer layer. Then, with fine diamond abrasive, the wafer is polished. In this way, a thick film substrate of the oxygen-doped n-type GaN having 300 $\mu$m thickness is obtained.

Figure 6:
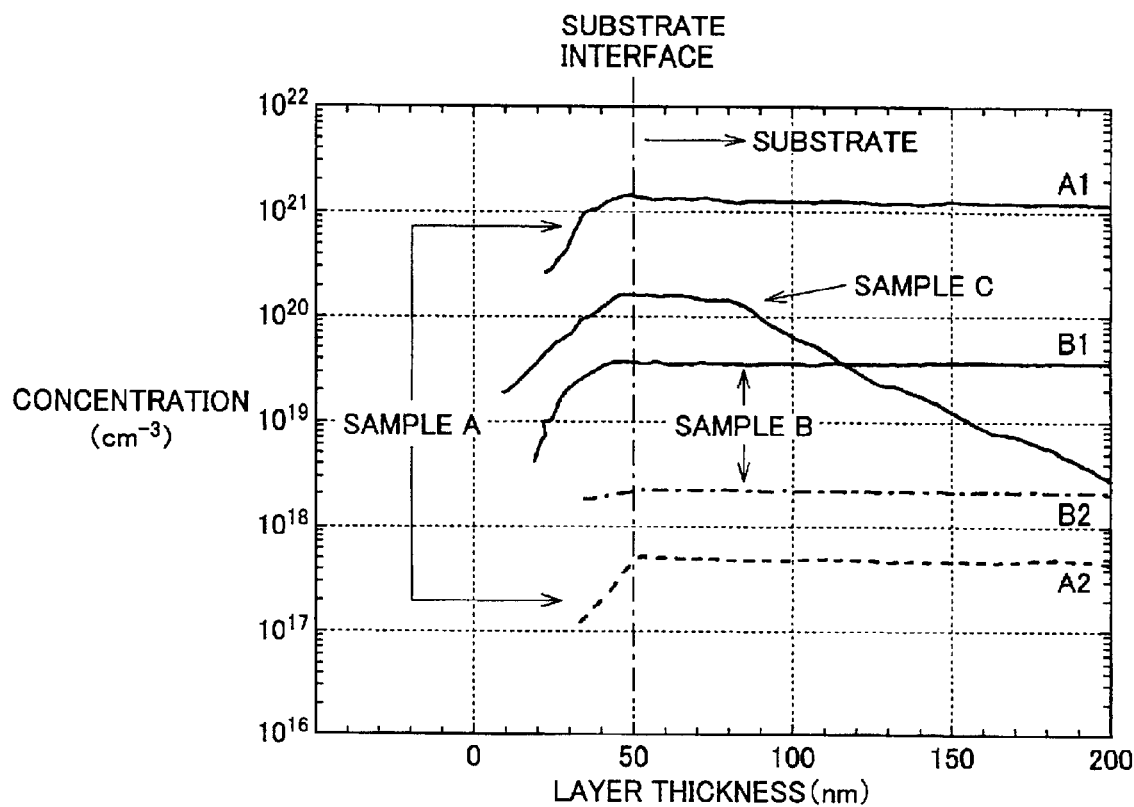
FIG. 6 is a graph showing other SIMS profiles of the oxygen concentration in the vicinity of the GaN substrate interfaces in the present invention.

GaN substrate 301 in the second embodiment has SIMS profiles as shown in FIG. 6, where the profiles are indicated as sample A. Curve A1 of sample A represents a concentration profile of oxygen contained in the GaN substrate of the second embodiment. It is seen that oxygen of concentration 1.2×10$^{21}$ cm$^{-3}$ is uniformly contained in the GaN substrate from the front to rear surfaces. Curve A2 represents Cl concentration. Cl of concentration 5×10$^{17}$ cm$^{-3}$ is detected, and a reason for this is considered that the lower growth temperature of the GaN substrate of the second embodiment relative to that of the first embodiment allows Cl to readily be taken into crystal. If the substrate is grown at a high temperature as that of the first embodiment or an increased amount of oxygen is used for doping, no such chlorine would be detected. It is confirmed that resultant light-emitting devices have an emission output which is about 1.5 times as high as that of conventional devices.

In FIG. 6, SIMS profiles indicated as sample B are of a GaN substrate produced by using TEOS as the n-type dopant. It is seen from the profiles that oxygen of concentration 3.5×10$^{19}$ cm$^{-3}$ represented by curve B1 and silicon of concentration 2.1×10$^{18}$ cm$^{-3}$ represented by curve B2 are uniformly contained in the GaN substrate from the front to rear surfaces. This means that the substrate is doped with both of O and Si contained in TEOS. In addition, the advantage derived by doping substrate 301 with oxygen can be obtained also by modulation doping represented as sample C in FIG. 6 for example.

According to the second embodiment, like the first embodiment, a plurality of nitride semiconductor layers and electrodes as shown in FIG. 3 are formed on oxygen-doped n-type GaN substrate 301. A resultant wafer is divided into light-emitting device chips and then respective LEDs are completed through resin molding.

The light-emitting device of the second embodiment has an operating voltage of 2.0 V at the forward current of 20 mA. The device emits blue light with a peak wavelength of 470 nm, and emission output thereof is 5 mW. When the forward current varies within 5 mA to 20 mA, the peak wavelength shifts by 1 nm or less. The distribution of peak 25. wavelengths of a plurality of light-emitting devices obtained from the same wafer is within 5 nm. The light-emitting devices have their lifetimes of at least 25,000 hours under a room-temperature continuous energization test with 20 mA.

On the other hand, a GaN substrate for comparison is produced without intentional or positive oxygen doping. In other words, this Si-doped GaN substrate does not have an oxygen concentration exceeding 10$^{16}$ cm$^{-3}$ with measurement by SIMS. An LED formed on this substrate and having the cross-sectional structure as shown in FIG. 3 has an operating voltage of 3.4 V at the forward current of 20 mA. This LED emits blue light with a peak wavelength of 470 nm and has an emission output of 3 mW. The peak wave length shifts by 5 nm as the current changes. The distribution of peak wavelengths of light-emitting devices obtained from the same wafer is within 10 nm, and the light-emitting devices have their lifetimes of 10,000 hours.

It is seen from the above that oxygen doping inside the GaN substrate can reduce crystal defects not only in the GaN substrate interface region but also in a plurality of nitride semiconductor layers grown on that substrate, and accordingly can improve emission output of light-emitting devices. Further, since the oxygen doping improves electrical characteristics of nitride semiconductor crystal, the operating voltage of light-emitting devices can be reduced. It is further seen from the second embodiment that the same advantage of the present invention is achieved if TEOS is employed as n-type dopant which causes simultaneous Si doping. In addition, although Si-doped GaN layer 502 is directly grown on the GaN substrate by MOCVD in the first and second embodiments, a buffer layer may be grown first and thereafter Si-doped GaN layer 502 may be formed thereon.

As seem from the above, the light-emitting devices of the second embodiment exhibit the 1.7 times emission output, one-fifth peak wavelength shift, half peak wavelength distribution, more than double lifetime, and operating voltage reduced from 3.4 V to 2.0 V as compared with the conventional devices.

Third Embodiment

Figure 7:
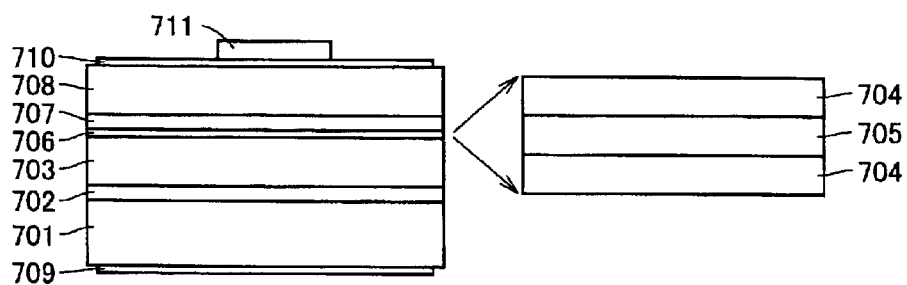
FIG. 7 diagrammatically shows a cross section of a nitride semiconductor light-emitting device as another example according to the present invention.

FIG. 7 diagrammatically shows a cross section of a light-emitting device according to a third embodiment of the present invention. The light-emitting device includes an Si-doped n-type GaN substrate 701 produced by HVPE. A substrate interface region is doped with oxygen by supplying a source gas for oxygen into a reactor, when a GaN buffer layer 702 is deposited on substrate 701 by MOCVD. On oxygen-doped n-type GaN buffer layer 702, an Si-doped n-type GaN layer 703 and a light-emitting layer 706 are successively deposited. Light-emitting layer 706 has a DQW (double quantum well) structure including Si-doped InGaN layers 704 and a non-doped GaN layer 705. On light-emitting layer 706, an AlGaN anti-evaporation layer 707 and an Mg-doped p-type GaN layer 708 are successively deposited. Finally, an n-type electrode 709, a p-type light-transmissive electrode 710 and a p-type electrode 711 are formed by vapor phase deposition.

In the third embodiment, HVPE is used for growth of GaN substrate 701. Specifically, Ga metal is heated to 850° C. to react with HCl gas, and resultant $GaCl_3$ is used as a transport gas for group III element Ga. $NH_3$ is used as a transport gas for group V element N. $SiH_4$ is used as a transport gas for n-type dopant Si, and then $Cp_2Mg$ or ethyl $Cp_2Mg$ is used as a transport gas for p-type dopant Mg. A sapphire substrate is employed as a base substrate on which the GaN substrate is grown.

In order to produce GaN substrate 701 shown in FIG. 7, the sapphire substrate is first heated to 1100° C. in period 401 in FIG. 4. In period 402, the substrate is thermally cleaned in a hydrogen atmosphere. After this, in period 403, the substrate temperature is lowered to 550° C., and the temperature is made stable in period 404. In period 405, a GaN buffer layer is grown on the sapphire substrate to 50 nm thickness. Then, in period 406, the substrate temperature is raised to 1050° C. In period 407, a thick film of Si-doped GaN is grown to 310 $\mu$m thickness at a deposition rate of 60 $\mu$m/h. After the film deposition, in period 408, the substrate temperature is lowered to room temperature. A resultant wafer is lapped from the sapphire substrate side by a grinding machine to remove the sapphire substrate and the GaN buffer layer. Then, with fine diamond abrasive, the wafer is polished. In this way, the Si-doped GaN substrate of 300 $\mu$m thickness is obtained.

The produced Si-doped GaN substrate 701 is thermally cleaned in a hydrogen atmosphere containing $NH_3$, and n-type GaN buffer layer 702 doped with oxygen by means of $O_2$ gas is grown on this substrate to 35 nm thickness. The oxygen for doping diffuses through thermal hysteresis during formation of a plurality of nitride semiconductor layers, so that the substrate interface region is doped with oxygen. On buffer layer 702, Si-doped n-type GaN layer 703 is grown to 0.5 $\mu$m thickness. Then, light-emitting layer 706 is grown including 2 nm-thick Si-doped $In_{0.35}Ga_{0.65}N$ quantum well layers 704 and 20 nm-thick non-doped GaN barrier layer 705 and thus having a multiple quantum well structure with period 2 (formed of two well layers and one barrier layer). After this, 25 nm-thick Mg-doped p-type $Al_{0.2}Ga_{0.8}N$ anti-evaporation layer 707 and 0.5 $\mu$m-thick Mg-doped p-type GaN layer 708 are successively grown. On the rear side of Si-doped n-type GaN substrate 701 of the wafer, n-type electrode 709 of Ti/Al is vapor-deposited, and on the surface of Mg-doped p-type GaN layer 708, p-type light-transmissive electrode 710 of Pd and p-type electrode 711 of Pd/Au are successively vapor-deposited. Then, the wafer is divided into a plurality of light-emitting device chips (see FIG. 7), and respective LEDs are completed through resin molding. Here, materials for p-type light-transmissive electrode 710 and p-type electrode 711 may be Ni and Ni/Au respectively.

Figure 8:
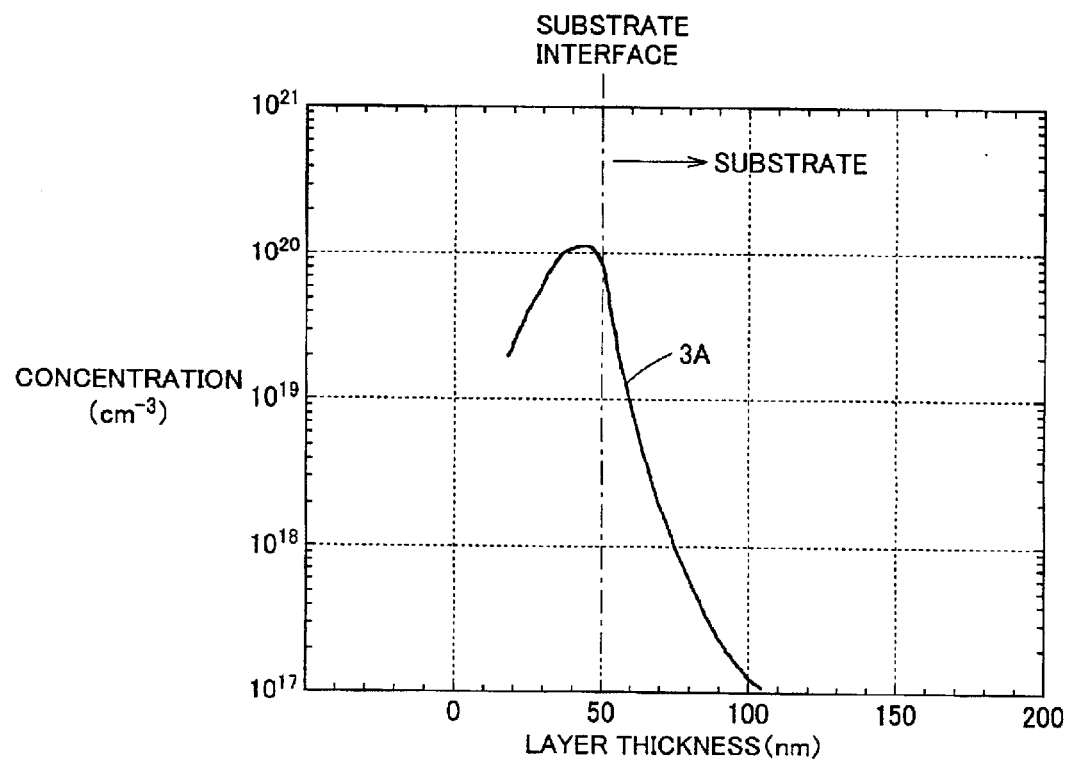
FIG. 8 is a graph showing still another SIMS profile of the oxygen concentration in the vicinity of the GaN substrate interface in the present invention.

A graph of FIG. 8 shows an SIMS profile in the vicinity of the substrate interface in the light-emitting device of the third embodiment. Specifically, curve 3A represents an oxygen concentration profile in the region near the interface of the GaN substrate of the third embodiment. It is seen that the maximum concentration of oxygen atoms contained in this region is $1.1 \times 10^{20}$ $cm^{-3}$.

The light-emitting device of the third embodiment has an operating voltage of 2.8 V at the forward current of 20 mA. The device emits blue light with a peak wavelength of 470 nm, and emission output thereof is 5.3 mW. When the forward current varies within 5 mA to 20 mA, the peak wavelength shifts by 1 nm or less. The distribution of peak wavelengths of a plurality of light-emitting devices obtained from the same wafer is within 5 nm. The light-emitting devices have their lifetimes of at least 19,000 hours under a room-temperature continuous energization test with 20 mA.

On the other hand, a GaN substrate for comparison is produced without intentional or positive oxygen doping. In other words, this Si-doped GaN substrate does not have an oxygen concentration exceeding $10^{16}$ $cm^{-3}$ with measurement by SIMS. An LED formed on this substrate and having the cross-sectional structure as shown in FIG. 7 has an operating voltage of 3.7 V at the forward current of 20 mA. This LED emits blue light with a peak wavelength of 470 nm and has an emission output of 2.7 mW. The peak wavelength shifts by 5 nm as the current changes. The distribution of peak wavelengths of light-emitting devices obtained from the same wafer is within 10 nm, and the light-emitting devices have their lifetimes of 12,000 hours.

It is seen from the above that oxygen doping in the vicinity of the GaN substrate interface can reduce crystal defects not only in the GaN substrate interface region but also in a plurality of nitride semiconductor layers grown on that substrate, and accordingly can improve emission output of light-emitting devices. Further, since the oxygen doping improves electrical characteristics of nitride semiconductor crystal, the operating voltage of light-emitting devices can be reduced.

As seen from the above, the light-emitting devices of the third embodiment exhibit the 1.4 times emission output, one-fifth peak wavelength shift, a half peak wavelength distribution, at least 1.5 times lifetime, and operating voltage reduced from 3.7 V to 2.8 V, as compared with the conventional devices.

Fourth Embodiment

Figure 9:
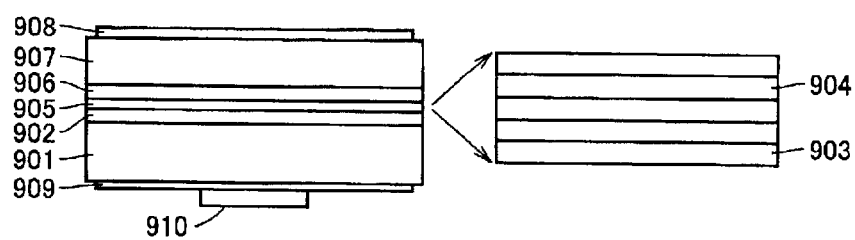
FIG. 9 diagrammatically shows a cross section of a nitride semiconductor light-emitting device as still another example according to the present invention.

FIG. 9 diagrammatically shows a cross section of a light-emitting device according to a fourth embodiment of the present invention. The light-emitting device includes an Mg-doped p-type GaN substrate 901 produced by HVPE. Oxygen doping is accomplished by supplying a source gas for oxygen into a reactor before the end of growth of substrate 901. Then, on this substrate 901, a plurality of nitride semiconductor layers are deposited by MOCVD. Specifically, an Mg-doped p-type GaN clad layer 902 and a light-emitting layer 905 are successively deposited. Light-emitting layer 905 has an MQW (multiple quantum well) structure including Si-doped InGaN layers 903 of period 3 and non-doped GaN layers 904 of period 2. On light-emitting layer 905, an AlGaN anti-evaporation layer 906 is formed for preventing evaporation of the light-emitting layer in the manufacturing process, and then an Si-doped n-type GaN layer 907 is deposited thereon. Finally, an n-type electrode 908, a p-type light-transmissive electrode 909 and a p-type electrode 910 are formed by vapor phase deposition. A method of manufacturing this light-emitting device is hereinafter described in more detail.

HVPE is utilized for growing the GaN substrate 901. Specifically, Ga metal is heated to 850° C. to react with HCl gas, and resultant $GaCl_3$ is used as a transport gas for group III element Ga. $NH_3$ is used as a transport gas for group V element N. $SiH_4$ or TEOS is used as a transport gas for n-type dopant Si or O, and then $Cp_2Mg$ or ethyl $Cp_2Mg$ is used as a transport gas for p-type dopant Mg. A sapphire substrate is employed as a base substrate on which the GaN substrate is grown.

In order to produce GaN substrate 901 shown in FIG. 9, the sapphire substrate is first heated to 1100° C. in period 401 in FIG. 4. In period 402, the substrate is thermally cleaned in a hydrogen atmosphere. After this, in period 403, the substrate temperature is lowered to 550° C., and the temperature is made stable in period 404. In period 405, a GaN buffer layer is grown on the sapphire substrate to 50 nm thickness. Then, in period 406, the substrate temperature is raised to 1050° C. In period 407, a thick film of Mg-doped p-type GaN is grown to 310 μm thickness at a deposition rate of 60 μm/h. When this p-type GaN thick film is being grown, the film is doped with oxygen by means of $O_2$ gas. Here, oxygen acts as donor in the GaN crystal, and thus the p-type GaN thick film is doped with oxygen within a predetermined amount.

Figure 10:
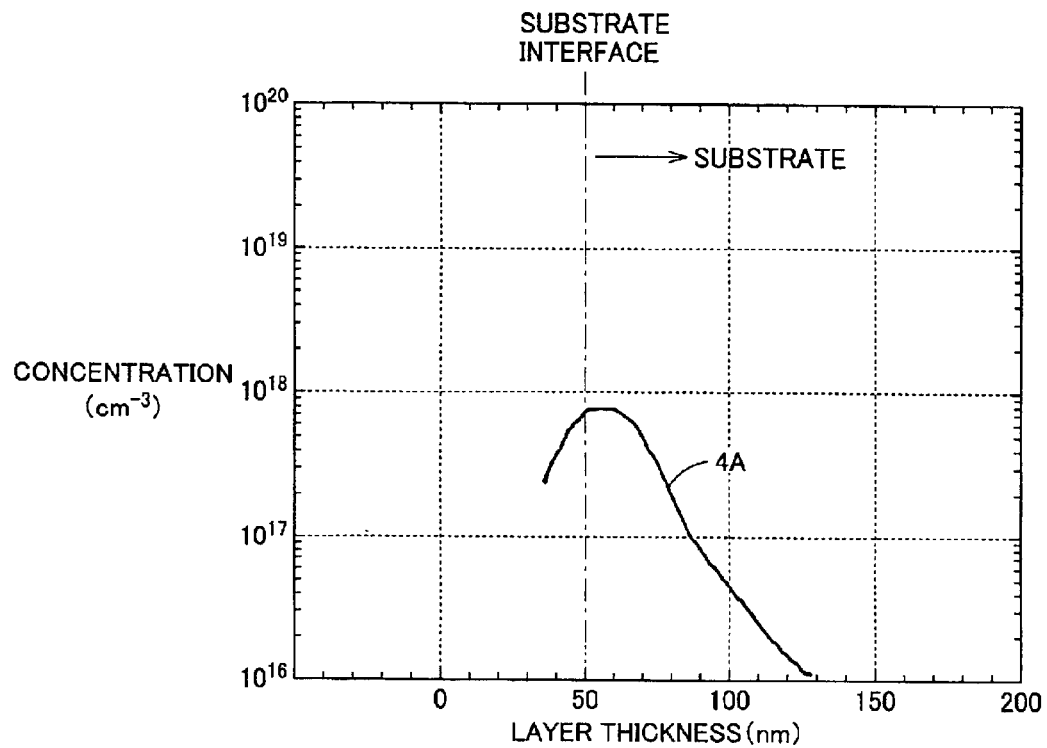
FIG. 10 is a graph showing still another SIMS profile of the oxygen concentration in the vicinity of the GaN substrate interface in the present invention.

A graph of FIG. 10 shows an SIMS profile in the vicinity of the substrate interface in a completed light-emitting device of the fourth embodiment. Specifically, curve 4A represents an oxygen concentration profile in the region near the interface of the GaN substrate of this embodiment. It is seen that the maximum concentration of oxygen atoms is $7.8 \times 10^{17}$ $cm^{-3}$ in this region. A resultant wafer is lapped from the sapphire substrate side by a grinding machine to remove the sapphire substrate and the GaN buffer layer. Then, with fine diamond abrasive, the wafer is polished. In this way, a thick film substrate of Mg-doped p-type GaN having 300 μm thickness is obtained.

MOCVD is used for growing a plurality of nitride-based semiconductor layers on the p-type thick-film substrate that are included in the light-emitting device. TMG (trimethyl gallium), TEG (triethyl gallium), TMI (trimethyl indium), and/or TMA (trimethyl aluminum) is used as a transport gas for group III element. $NH_3$ is used as a transport gas for group V element. $SiH_4$ is used as a transport gas for n-type dopant, and then $Cp_2Mg$ or ethyl $Cp_2Mg$ is used as a transport gas for p-type dopant.

Figure 11:
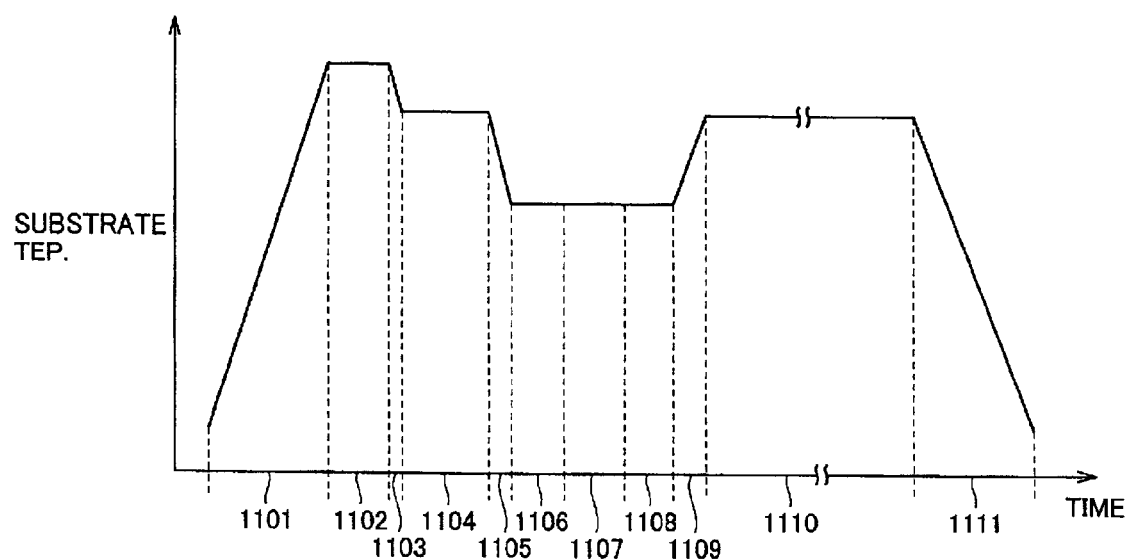
FIG. 11 is a graph showing substrate temperature in a process of manufacturing a nitride semiconductor light-emitting device in the present invention.

In a period 1101 in FIG. 11, p-type substrate 901 is first heated to 1100° C. In a period 1102, the substrate is thermally cleaned in a nitrogen atmosphere at 1100° C. After this, in a period 1103, the substrate temperature is lowered to 1050° C., and in a period 1104, 25 nm-thick Mg-doped p-type $Al_{0.1}Ga_{0.9}N$ clad layer 902 is grown. Then, in a period 1105, the substrate temperature is lowered to 800° C. In a period 1106, the temperature is made stable. In a period 1107, light-emitting layer 905 is grown including 2 nm-thick Si-doped $In_{0.35}Ga_{0.65}N$ quantum well layers 903 and 20 nm-thick Si-doped GaN barrier layers 904 and thus having a multiple quantum well structure with period 3 (formed of three well layers and two barrier layers). After this, 25 nm-thick Si-doped n-type $Al_{0.1}Ga_{0.9}N$ anti-evaporation layer 906 is grown in a period 1108. In a period 1109, the substrate temperature is raised to 1050° C. In a period 1110, 4 μm-thick Si-doped n-type GaN layer 907 is grown. After the film deposition, the substrate temperature is lowered to room temperature in a period 1111.

On the rear side of Mg-doped p-type GaN substrate 901 of the wafer, p-type light-transmissive electrode 909 of Pd and p-type electrode 910 of Pd/Au are successively vapor-deposited, and on the surface of Si-doped n-type GaN layer 907, n-type electrode 908 of Ti/Al is vapor-deposited. Then, the wafer is divided into a plurality of light-emitting device chips (see FIG. 9), and respective LEDs are completed through resin molding.

The light-emitting device of the fourth embodiment has an operating voltage of 3.0 V at the forward current of 20 mA. The device emits blue light with a peak wavelength of 470 nm, and emission output thereof is 5.8 mW. When the forward current varies within 5 mA to 20 mA, the peak wavelength shifts by 1 nm or less. The distribution of peak wavelengths of a plurality of light-emitting devices obtained from the same wafer is within 5 nm. The light-emitting devices have their lifetimes of at least 20,000 hours under a room-temperature continuous energization test with 20 mA.

On the other hand, a GaN substrate for comparison is produced without intentional or positive oxygen doping. In other words, this Si-doped GaN substrate does not have an oxygen concentration exceeding $10^{16}$ $cm^{-3}$ with measurement by SIMS. An LED formed on this substrate and having the cross-sectional structure as shown in FIG. 9 has an operating voltage of 3.8 V at the forward current of 20 mA. This LED emits blue light with a peak wavelength of 470 nm and has an emission output of 2.5 mW. The peak wave length shifts by 5 nm as the current changes. The distribution of peak wavelengths of light-emitting devices obtained from the same wafer within 10 nm, and the light-emitting devices have their lifetimes of 11,000 hours.

It is seen from the above that oxygen doping in the vicinity of the p-type GaN substrate interface can reduce crystal defects not only in the GaN substrate interface region but also in a plurality of nitride semiconductor layers grown on that substrate, and accordingly can improve emission output of light-emitting devices.

As seen from the above, Light-emitting devices of the fourth embodiment exhibit the 2.3 times emission output, one-fifth peak wavelength shift, half peak wavelength distribution, at least 1.8 times lifetime, and operating voltage reduced from 3.8 V to 3.0 V, as compared with the conventional devices.

Fifth Embodiment

Figure 12:
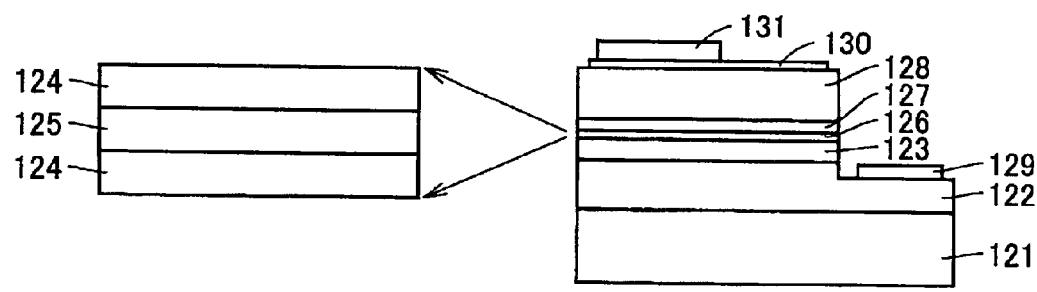
FIG. 12 diagrammatically shows a cross section of a nitride semiconductor light-emitting device as a further example according to the present invention.

A fifth embodiment differs from the first to fourth embodiments in that the sapphire base substrate and GaN buffer layer used for producing the GaN thick-film substrate are not removed by lapping. Here, a light-emitting device shown in FIG. 12 is used as one example and accordingly described. The light-emitting device of FIG. 12 is different from the device of FIG. 3 only in that the device of FIG. 12 has an n electrode formed on the front side of the substrate, since the device includes the insulative sapphire substrate and thus the n electrode cannot be formed on the rear side of the substrate. The light-emitting device of FIG. 12 includes an Si-doped GaN thick-film substrate 122, an Si-doped n-type GaN layer 123 and a light-emitting layer 126 deposited successively on sapphire base substrate 121. Light-emitting layer 126 has a DQW (double quantum well) structure including Si-doped InGaN layers 124 and a non-doped GaN layer 125. On light-emitting layer 126, an AlGaN anti-evaporation layer 127 and an Mg-doped p-type GaN layer 128 are successively deposited. The light-emitting device of FIG. 12 includes an n-type electrode 129, a p-type light-transmissive electrode 130 and a p-type electrode 131. It is noted that the buffer layer between sapphire base substrate 121 and Si-doped GaN thick-film substrate 122 is not shown in FIG. 12.

According to the fifth embodiment, GaN thick-film layer 122 is formed on sapphire base substrate 121 by a similar method as that of the first embodiment. Here, as the sapphire base substrate and buffer layer are not removed by grinding in the fifth embodiment, GaN thick-film layer 122 is grown to a thickness of 300 μm, not to 310 μm. Oxygen doping in the fifth embodiment is accomplished by adsorption of oxygen on the surface of GaN thick-film layer 122 in the atmosphere as done in the first embodiment. Further, a plurality of nitride-based semiconductor layers included in the light-emitting device of FIG. 12 are formed on GaN thick-film layer 122 by a method similar to that of the first embodiment.

In a resultant wafer including a plurality of deposited nitride semiconductor layers, photolithography and dry etching are carried out to expose a part of Si-doped GaN thick-film layer 122, as shown in FIG. 12. On the exposed part of the layer 122, n-type electrode 129 of Ti/Al is vapor-deposited. On Mg-doped p-type GaN layer 128, p-type light-transmissive electrode 130 of Pd and p-type electrode 131 of Pd/Au are successively vapor-deposited. After this, the wafer is divided into a plurality of light-emitting device chips (see FIG. 11) and respective LEDs are completed through resin molding. It is noted that materials for p-type light-transmissive electrode 130 and p-type electrode 131 may be Ni and Ni/Au, respectively.

The light-emitting device of the fifth embodiment has an operating voltage of 2.7 V at the forward current of 20 mA. The device emits blue light with a peak wavelength of 470 nm, and emission output thereof is 5.5 mW. When the forward current varies within 5 mA to 20 mA, the peak wavelength shifts by 1 nm or less. The distribution of peak wavelengths of a plurality of light-emitting devices obtained from the same wafer is within 5 nm. The light-emitting devices have their lifetimes of at least 20,000 hours under a room-temperature continuous energization test with 20 mA.

On the other hand, a GaN substrate for comparison is produced without intentional or positive oxygen doping. In other words, this Si-doped GaN substrate does not have an oxygen concentration exceeding $10^{16}$ cm$^{-3}$ with measurement by SIMS. An LED formed on this substrate and having the cross-sectional structure as shown in FIG. 12 has an operating voltage of 3.6 V at the forward current of 20 mA. This LED emits blue light with a peak wavelength of 470 nm and has an emission output of 2.9 mW. The peak wave length shifts by 5 nm as the current changes. The distribution of peak wavelengths of light-emitting devices obtained from the same wafer within 10 nm, and the light-emitting devices have their lifetimes of 13,000 hours.

It is seen from the above that oxygen doping in the vicinity of the GaN substrate interface can reduce crystal defects not only in the GaN substrate interface region but also in a plurality of nitride semiconductor layers grown on that substrate, and accordingly can improve emission output of light-emitting devices. Further, since the oxygen doping improves electrical characteristics of nitride semiconductor crystal, the operating voltage of light-emitting devices can be reduced. It is noted that the light-emitting device of FIG. 12 may include a non-doped GaN thick film instead of n-type GaN thick film 122 and then Si-doped GaN layer 123 may partially be exposed on which an n-type electrode is formed.

As seen from the above, the light-emitting devices of the fifth embodiment exhibit the 1.9 times emission output, one-fifth peak wavelength shift, half peak wavelength distribution, at least twice lifetime, and operating voltage reduced from 3.6 V to 2.7 V, as compared with the conventional devices.

It is understood that, from the various embodiments described above, the present invention can improve the operating voltage, emission efficiency, lifetime, and yield of nitride-based semiconductor light-emitting devices by doping with oxygen the substrate interface region of the semiconductor light-emitting devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-based semiconductor light-emitting device comprising:

a silicon doped n-type GaN-based substrate; and a semiconductor stacked-layer structure including a plurality of nitride-based semiconductor layers grown on said GaN-based substrate by metal-organic chemical vapor phase deposition, said GaN-based substrate having an interface region contacting said semiconductor stacked-layer structure and said interface region containing oxygen atoms and said GaN-based substrate grown by hydride vapor phase epitaxy method, said semiconductor stacked-layer structure including a silicon doped n-type nitride-based semiconductor layer, a light-emitting layer, and a p-type nitride-based semiconductor layer in this order from the substrate side.

2. The nitride-based semiconductor light-emitting device according to claim 1, wherein said interface region contains oxygen atoms at concentration n in the range of $2\times10^{16} \leq n \leq 10^{22}$ cm$^{-3}$.

3. A nitride-based semiconductor light-emitting device comprising:
   a GaN-based substrate including a p-type impurity; and
   a semiconductor stacked-layer structure including a plurality of nitride-based semiconductor layers grown on said GaN-based substrate by metal-organic chemical vapor phase deposition,
   said GaN-based substrate having an interface region contacting said semiconductor stacked-layer structure and said interface region containing oxygen atoms and said GaN-based substrate grown by hydride vapor phase epitaxy method,
   said semiconductor stacked-layer structure including a p-type nitride-based semiconductor layer, a light-emitting layer, and an n-type nitride-based semiconductor layer in this order from the substrate side.

4. The nitride-based semiconductor light-emitting device according to claim 3 wherein said p-type impurity includes magnesium.

5. The nitride-based semiconductor light-emitting device according to claim 3, wherein
   said interface region contains oxygen atoms at concentration n in the range of $2 \times 10^{16} \leq n \leq 10^{22}$ cm$^{-3}$.

6. The nitride-based semiconductor light-emitting device according to claim 1, wherein
   said GaN-based substrate grown by hydride vapor phase epitaxy method contains chlorine.

7. The nitride-based semiconductor light-emitting device according to claim 3, wherein
   said GaN-based substrate grown by hydride vapor phase epitaxy method contains chlorine.

* * * * *